(12) United States Patent
Sun

(10) Patent No.: US 8,637,916 B2
(45) Date of Patent: Jan. 28, 2014

(54) SEMICONDUCTOR DEVICE WITH MINI SONOS CELL

(75) Inventor: Ya Ya Sun, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 457 days.

(21) Appl. No.: 12/758,767

(22) Filed: Apr. 12, 2010

(65) Prior Publication Data

US 2011/0248331 A1 Oct. 13, 2011

(51) Int. Cl.
*H01L 29/78* (2006.01)

(52) U.S. Cl.
USPC .......... 257/324; 257/335; 257/E29.309; 257/E21.546

(58) Field of Classification Search
USPC .......... 257/324, E29.309, E21.546
See application file for complete search history.

(56) References Cited

U.S. PATENT DOCUMENTS

| | | | |
|---|---|---|---|
| 6,054,343 A * | 4/2000 | Ashburn | 438/221 |
| 7,029,976 B1 | 4/2006 | Nagarad | |
| 7,585,746 B2 | 9/2009 | Jung | |
| 2002/0031890 A1* | 3/2002 | Watanabe et al. | 438/296 |
| 2004/0009645 A1* | 1/2004 | Yoo | 438/315 |
| 2005/0093058 A1* | 5/2005 | Park et al. | 257/324 |
| 2005/0186741 A1* | 8/2005 | Roizin et al. | 438/275 |
| 2005/0253189 A1* | 11/2005 | Cho et al. | 257/330 |
| 2005/0285177 A1* | 12/2005 | Shone | 257/315 |
| 2006/0006436 A1* | 1/2006 | Mouli | 257/290 |
| 2006/0033129 A1* | 2/2006 | Mouli | 257/291 |
| 2006/0141708 A1* | 6/2006 | Kim et al. | 438/259 |
| 2007/0077707 A1* | 4/2007 | Jung | 438/257 |
| 2007/0126054 A1* | 6/2007 | Jung | 257/324 |
| 2009/0072274 A1* | 3/2009 | Knoefler et al. | 257/204 |

FOREIGN PATENT DOCUMENTS

WO 2006116466 A1 11/2006

* cited by examiner

*Primary Examiner* — Minh-Loan T Tran
*Assistant Examiner* — Fazli Erdem
(74) *Attorney, Agent, or Firm* — Winston Hsu; Scott Margo

(57) ABSTRACT

A semiconductor device with mini silicon-oxide-nitride-oxide-silicon (mini-SONOS) cell is disclosed. The semiconductor device includes: a semiconductor substrate; a shallow trench isolation (STI) embedded in the semiconductor substrate; a logic device partially overlapping the STI; and a SONOS cell formed in the overlapped region of the logic device and the STI.

14 Claims, 5 Drawing Sheets

US 8,637,916 B2

SEMICONDUCTOR DEVICE WITH MINI SONOS CELL

BACKGROUND OF THE INVENTION

1. Field of the Invention

The invention relates to a method for fabricating a semiconductor device, and more particularly, to a method for fabricating a semiconductor device with mini SONOS cells.

2. Description of the Prior Art

With increasing shrinkage of semiconductor devices, the integration degree is doubled every three years according to a scaling rule, and speed of semiconductor devices is increasing and power consumption thereof is decreasing. The production of finer MOS type FETs has been being accomplished by decreasing a dimension of a gate electrode, decreasing a thickness of a gate insulating layer and highly accurately controlling an impurity concentration profile in a channel forming region or in its vicinity. And, driving capability of semiconductor devices is improved and a parasitic capacitance thereof is decreased according to finer semiconductor devices. In general, in circuits having a CMOS structure, an operating rate is determined depending upon a rate of charging (or discharging) for giving an output of a logic gate at a certain stage to drive a capacitive load in a subsequent logic gate. Therefore, the operating rate is in proportion to the inverse number of capacity of the capacitive load and to the driving capability.

For accomplishing the formation of finer semiconductor devices, conventionally, there has been employed a logic gate structure adjacent to the MOS structure, i.e., a structure having a logic gate composed of a gate oxide layer and polysilicon gate electrode layer is disposed on a semiconductor substrate while the edges of the logic gate is sitting on a portion of two adjacent shallow trench isolations (STIs), in which a depletion region is created directly under the logic gate and between the two STIs. In this structure, as at least a portion of the STI is overlapped by the gate oxide layer of the logic gate, an inevitable edge fringing capacitance is created at the overlapped region, which in most circumstances, would induce an inverse narrow width effect.

SUMMARY OF THE INVENTION

It is an objective of the present invention to propose a novel structure and fabricating method thereof for resolving the aforementioned issues typically found in conventional semiconductor devices with logic gate.

A semiconductor device with mini silicon-oxide-nitride-oxide-silicon (mini-SONOS) cell is disclosed. The semiconductor device includes: a semiconductor substrate; a shallow trench isolation (STI) embedded in the semiconductor substrate; a logic device partially overlapping the STI; and a SONOS cell formed in the overlapped region of the logic device and the STI.

According to another aspect of the present invention, a semiconductor device with mini silicon-oxide-nitride-oxide-silicon (mini-SONOS) cell is disclosed. The semiconductor devices includes: a semiconductor substrate; a shallow trench isolation (STI) embedded in the semiconductor substrate; a logic device partially overlapping the STI; a first SONOS cell formed in a first overlapped region of the logic device and the STI; and a second SONOS cell formed in a second overlapped region of the logic device and the STI.

According to another aspect of the present invention, a method for fabricating a semiconductor device with mini-SONOS cell is disclosed. The method includes the steps of: providing a semiconductor substrate having a first MOS region and a second MOS region; forming a first trench in the semiconductor substrate between the first MOS region and the second MOS region; depositing a oxide liner and a nitride liner in the first trench; forming a STI in the first trench; removing a portion of the nitride liner for forming a second trench between the first MOS region of the semiconductor substrate and the STI and a third trench between the STI and the second MOS region of the semiconductor substrate; and forming a first conductive type nitride layer in the second trench.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
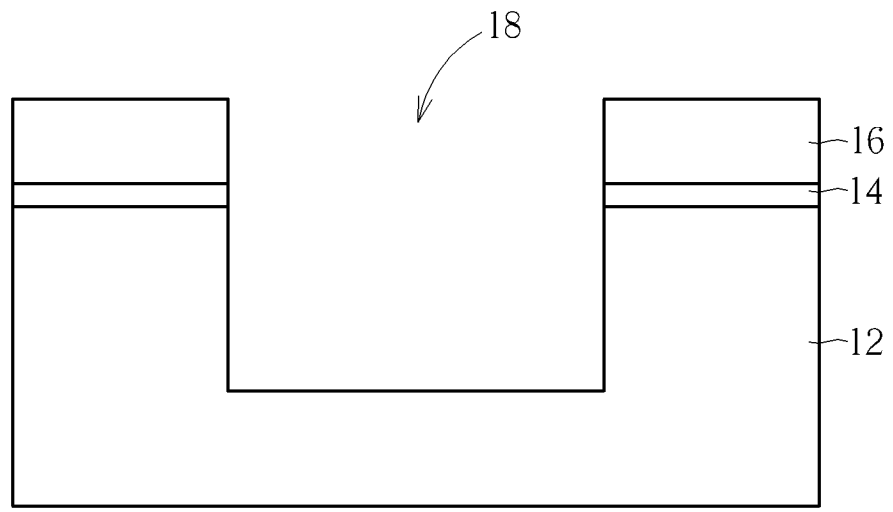
FIGS. 1-9 illustrate a method for fabricating a semiconductor device with two mini silicon-oxide-nitride-oxide-silicon (mini-SONOS) cells according to a preferred embodiment of the present invention.

Referring to FIGS. 1-9, FIGS. 1-9 illustrate a method for fabricating a semiconductor device with two mini silicon-oxide-nitride-oxide-silicon (mini-SONOS) cells according to a preferred embodiment of the present invention. As shown in FIG. 1, a semiconductor substrate 12 preferably composed of silicon is provided, and a pad oxide (not shown) and a pad nitride (not shown) are deposited on the substrate 12. A series of photo-etching processes are performed by using a patterned photoresist (not shown) to first remove a portion of the pad nitride for forming a patterned pad nitride 16, and then using the patterned pad nitride 16 as mask to remove a portion of the pad oxide and the substrate 12 for forming a patterned pad oxide 14 and a trench 18. Despite a series of photo-etching processes are preferably utilized to form the trench 18, only one photo-etching process could also be employed to remove a portion of the pad nitride, the pad oxide, and the substrate simultaneously for forming the trench 18, which is also within the scope of the present invention.

Figure 2:
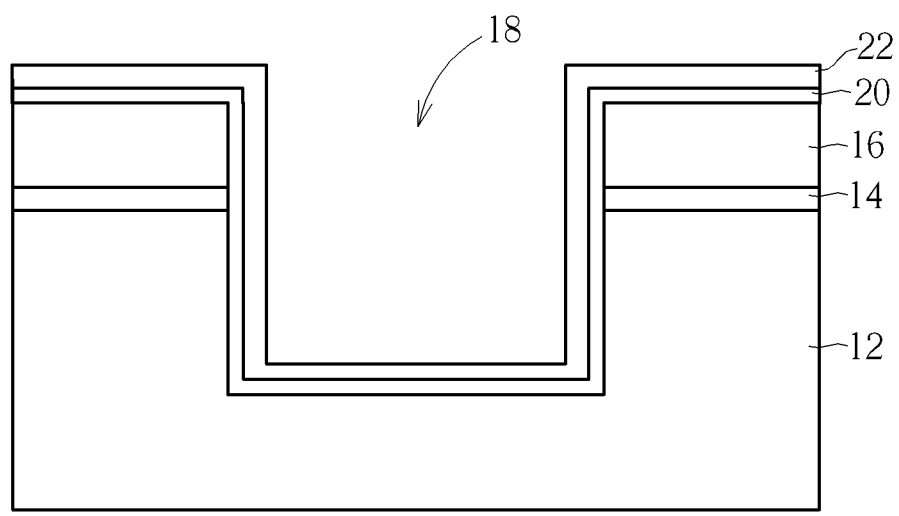

As shown in FIG. 2, a composite layer composed of an oxide liner 20 and a nitride liner 22 is deposited in the trench 18 while covering the top surface of the pad nitride 16 and the sidewall of the pad nitride 16, the pad oxide 14, and the substrate 12.

Figure 3:
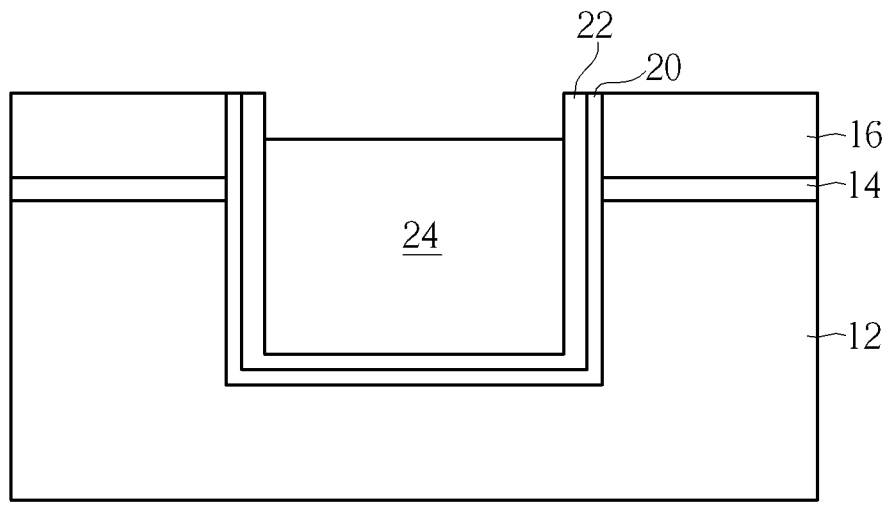

As shown in FIG. 3, a high density plasma (HDP) oxide deposition is performed to deposit a layer (not shown) preferably composed of oxide in the trench. The deposition of the oxide layer preferably fills the entire trench 18 and covering the surface of the nitride liner 22. A chemical mechanical polishing (CMP) process and an etching back are conducted thereafter to remove a portion of the oxide layer, the nitride liner 22, and the oxide liner 20. Preferably, the CMP process removes the oxide layer, the nitride liner 22 and the oxide liner 20 deposited on the top surface of the pad nitride 16 until the top surface of pad nitride 16 is exposed, and the etching back process then removes the remaining oxide layer until the top surface of the oxide layer is lower than the top surface of the pad nitride 16. The combination of the CMP process and the etching back process preferably forms a shallow trench isolation (STI) 24 in the trench 18.

Figure 4:
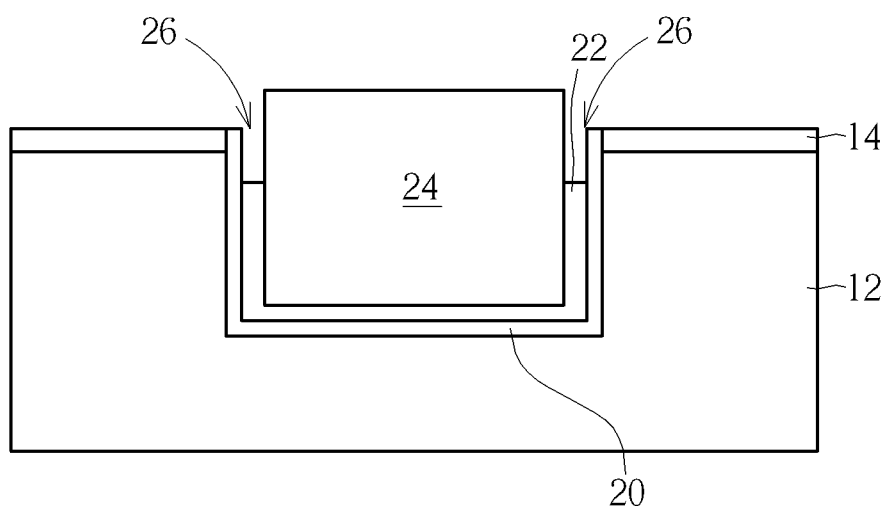

As shown in FIG. 4, an etching process is conducted by utilizing phosphoric acid to remove the pad nitride 16 entirely and a portion of the nitride liner 22 and the oxide liner 20 to form a plurality of trenches 26 between the remaining oxide liner 20 and the STI 24. The depth of the trenches 26 could be adjusted by altering parameters of the phosphoric acid etching, and as a portion of the nitride liner 22 is etched away, the trenches 26 preferably expose a portion the sidewall of the oxide liner 20 and the STI 24 and the remaining nitride liner 22. It should be noted that as the thickness of the deposited oxide liner 20 is preferably controlled between 10-20 Angstroms and the thickness of the pad oxide 14 is controlled between 110-120 Angstroms, the etching process preferably removes the oxide liner 20 between the pad nitride 16 and the nitride liner 22 along with the entire pad nitride 16 and part of the nitride liner 22 while leaving the pad oxide 14 intact.

Figure 5:
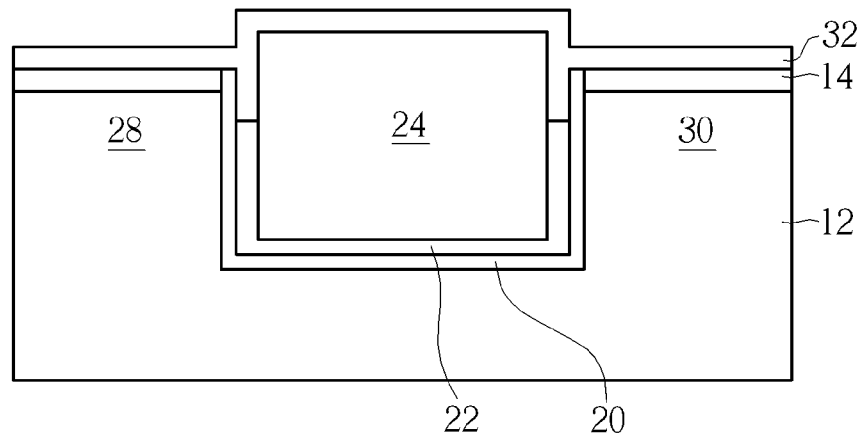

As shown in FIG. 5, a PMOS region 28 and a NMOS region 30 are defined on the substrate 12, and a p-type nitride layer, such as a boron doped nitride layer 32 is deposited to cover both the PMOS region 28 and the NMOS region 30 of the substrate 12. The boron doped nitride layer 32 is preferably deposited on the surface of the pad oxide 14 and the STI 24 while filling the trenches 26 entirely.

Figure 6:
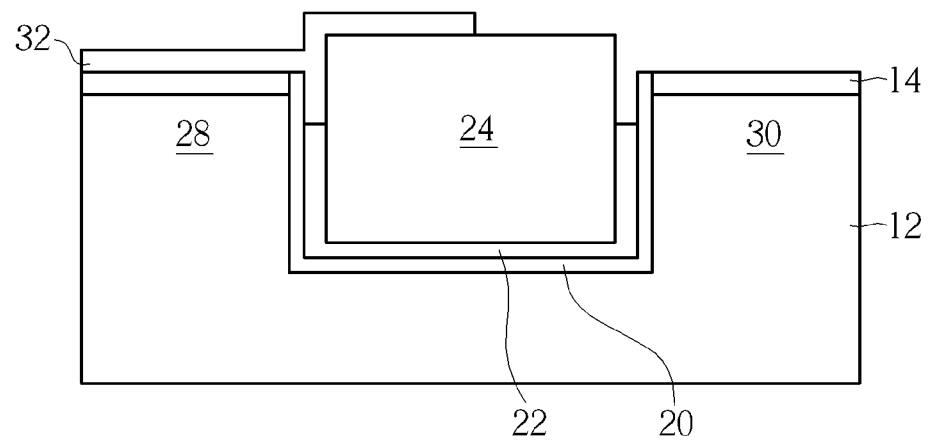

As shown in FIG. 6, a wet etching, such as through a photo-etching process is carried out to remove a portion of the boron doped nitride layer 32 from the NMOS region 30 of the substrate 12 and the boron doped nitride layer 32 filled in the trenches 26 between the STI 24 and the NMOS region 30 of the substrate 12 as the remaining boron doped nitride layer 32 is disposed on the PMOS region 28 of the substrate 12 and a portion of the STI 24.

Figure 7:
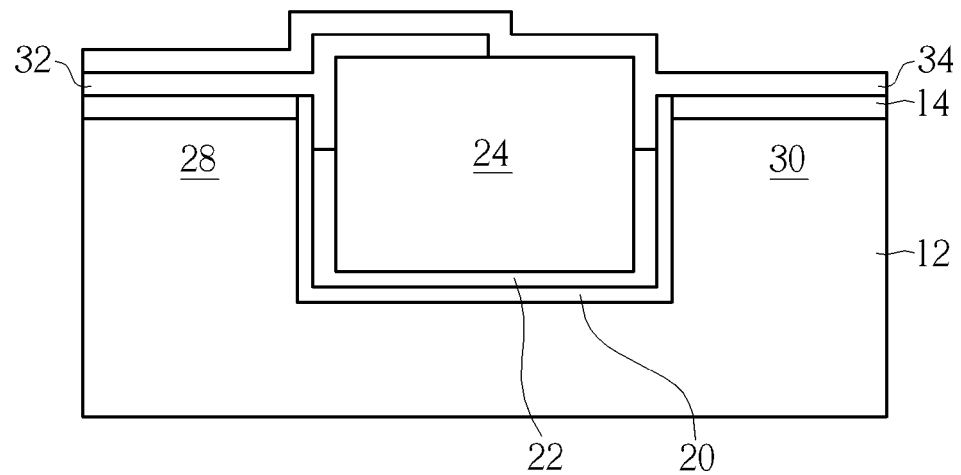

As shown in FIG. 7, an n-type nitride layer, such as a phosphorus doped nitride layer 34 is deposited on the NMOS region 30 and the PMOS region 28 of the substrate 12 while covering the boron doped nitride layer 32. The deposited phosphorus doped nitride layer 34 is preferably filled in the trench 26 between the STI 24 and the NMOS region 30 of the substrate 12 as the rest of the layer 34 is disposed on the STI 24 and the boron doped nitride layer 32.

Figure 8:
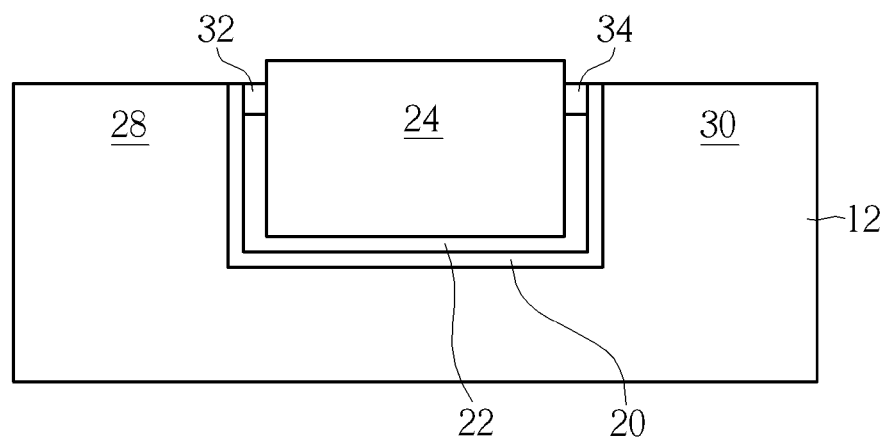

As shown in FIG. 8, a wet etching is conducted by using phosphoric acid to remove the boron doped nitride layer 32 and the phosphorus doped nitride layer 34 from the surface of the pad oxide 14 and the STI 24. After the boron doped nitride layer 32 and the phosphorus doped nitride layer 34 are removed, another etching process is performed by using hydrofluoric acid to remove the remaining pad oxide 14. It should be noted that despite a boron doped nitride layer 32 and a phosphorus doped nitride layer 34 are deposited in the adjacent trenches 26 respectively, the trenches 26 could also be filled with a nitride layer with only one conductive type. For instance, after the boron doped nitride layer 32 (or a phosphorus doped nitride layer) is deposited into the two trenches 26, as shown in FIG. 5, the two etching processes addressed in FIG. 8 could be carried out directly to first remove the boron doped nitride layer 32 from the surface of the pad oxide 14 and STI 24 while leaving the remaining boron doped nitride layer 32 in the two trenches 26 and then remove the pad oxide layer 14. This approach is also within the scope of the present invention.

Figure 9:
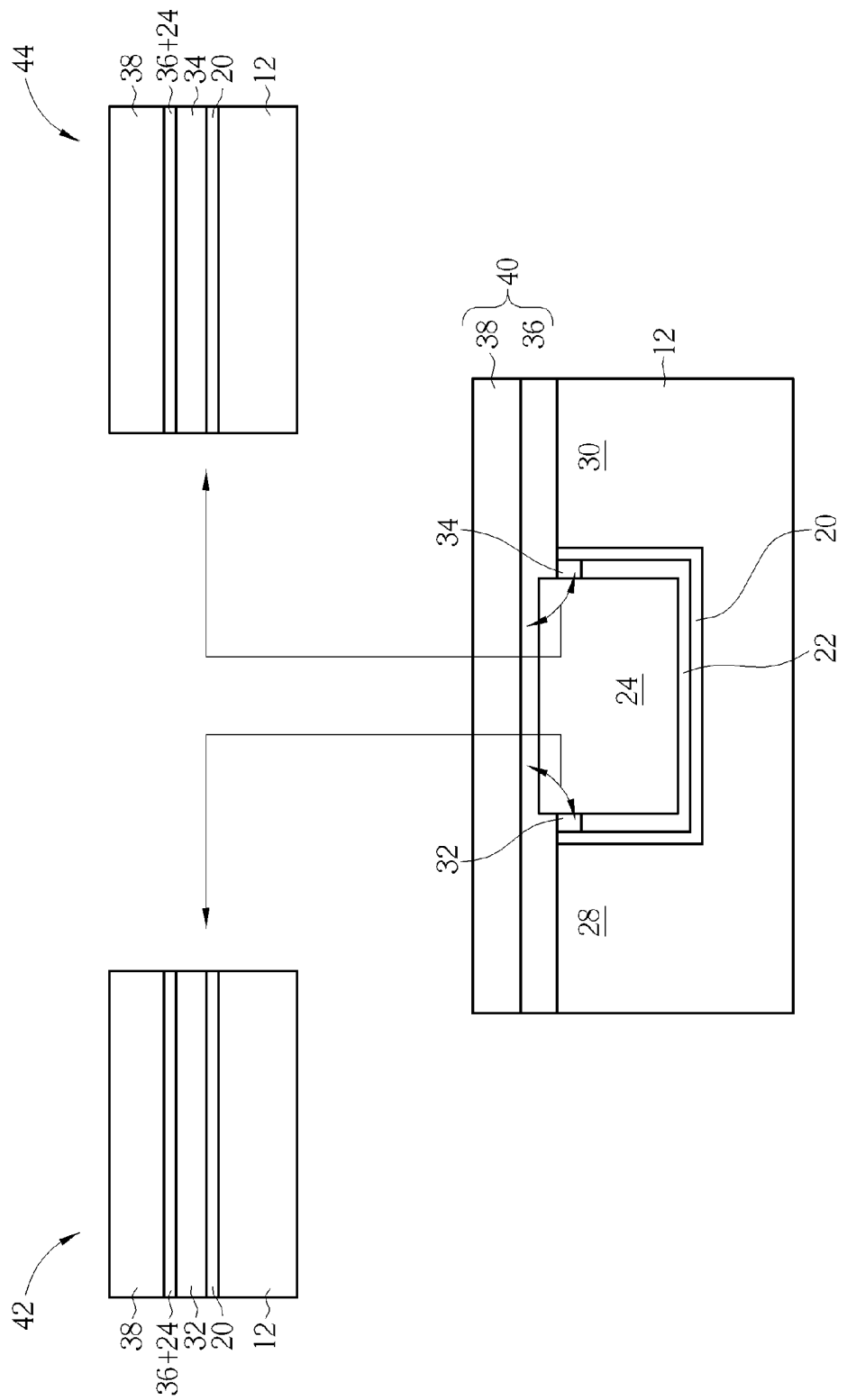

Next, as shown in FIG. 9, a gate oxide layer 36 and a polysilicon layer 38 are formed on the surface of the semiconductor substrate 12 and the STI 24, in which the gate oxide layer 36 and the polysilicon layer 38 deposited are preferably the gate oxide layer and polysilicon gate electrode layer formed in the MOS region. This completes the fabrication of a semiconductor device according to a preferred embodiment of the present invention.

By following the fabrication method revealed from FIGS. 1-9, a semiconductor device with two mini silicon-oxide-nitride-oxide-silicon (mini-SONOS) cells is accomplished, in which the gate oxide layer 36 and the polysilicon layer 38 together constitute a logic gate 40 of the semiconductor device, and two mini-SONOS cells 42, 44 are formed at the overlapped region of the logic gate 40 and the STI 24.

Preferably, the semiconductor device includes a semiconductor substrate 12, a STI embedded in the semiconductor substrate 12, a logic device (such as the aforementioned logic gate 40) at least partially overlapping the STI 24, and two SONOS cells 42, 44 disposed in the overlapped region of the logic gate 40 and the STI 24.

The device also includes a U-shaped nitride liner 22 disposed in the STI 24, a boron doped nitride layer 32 connected to one tip of the U-shaped nitride liner 22, and a phosphorus doped nitride layer 34 connected to the other tip of the U-shaped nitride liner 22. A U-shaped oxide liner 20 is disposed preferably between the substrate 12 and the U-shaped nitride liner 22, the boron doped nitride liner 32, and the phosphorus doped nitride liner 34.

The two mini-SONOS cells 42, 44 are preferably formed at the corners of the STI 24, such as in the region where the STI 24, the boron doped or phosphorus doped nitride layer, and the U-shaped oxide liner 20 are sandwiched. In this embodiment, the first mini-SONOS cell 42 includes a portion of the polysilicon layer 38, a portion of the gate oxide layer 36, the STI 24, the boron doped nitride layer 32, the U-shaped oxide liner 20, and the semiconductor substrate 12. The second mini-SONOS cell 44 formed at the other corner of the STI 24 opposite to the first mini-SONOS cell 42 preferably includes a portion of the polysilicon layer 38, a portion of the gate oxide layer 36, the STI 24, the phosphorus doped nitride layer 34, the U-shaped oxide liner 20, and the semiconductor substrate 12.

As two mini-SONOS cells are accomplished at the overlapping region between the logic gate and the STI, the present invention could fine-tune the voltage of the mini-SONOS cells by adjusting the dosage of the boron or phosphorous doped within the doped nitride layers 32, 34 of the two mini-SONOS cells 42, 44, which could then be used to adjust the threshold voltage (Vt) of the device and relieve the edge fringing effect found in conventional devices with logic gate.

Those skilled in the art will readily observe that numerous modifications and alterations of the device and method may be made while retaining the teachings of the invention.

What is claimed is:

1. A semiconductor device with mini silicon-oxide-nitride-oxide-silicon (mini-SONOS) cell, comprising:
   a semiconductor substrate;
   a shallow trench isolation (STI) embedded in the semiconductor substrate;
   a U-shaped nitride liner disposed between the STI and the semiconductor substrate;
   a doped nitride layer connected to the tip of the U-shaped nitride liner;
   a U-shaped oxide liner disposed between the semiconductor substrate and the U-shaped nitride liner, wherein the STI is on top of the U-shaped nitride liner and the U-shaped oxide liner;
   a logic device partially overlapping the STI; and
   a SONOS cell formed in the overlapped region of the logic device and the STI.

2. The semiconductor device with mini-SONOS cell of claim 1, wherein the logic device comprises a polysilicon layer and a gate oxide layer.

3. The semiconductor device with mini-SONOS cell of claim 1, wherein the STI comprises silicon oxide.

4. The semiconductor device with mini-SONOS cell of claim 1, wherein the SONOS cell comprises a portion of the polysilicon layer and the gate oxide layer of the logic device, the STI, the doped nitride layer, the U-shaped oxide liner, and the semiconductor substrate.

5. The semiconductor device with mini-SONOS cell of claim 1, wherein the doped nitride layer comprises a n-type doped nitride layer or a p-type doped nitride layer.

6. A semiconductor device with mini silicon-oxide-nitride-oxide-silicon (mini-SONOS) cell, comprising:
   a semiconductor substrate;
   a shallow trench isolation (STI) embedded in the semiconductor substrate;
   a U-shaped nitride liner disposed between the STI and the semiconductor substrate;
   a first doped nitride layer connected to one tip of the U-shaped nitride liner;
   a second doped nitride layer connected to another tip of the U-shaped nitride liner;
   a U-shaped oxide liner disposed between the semiconductor substrate and the U-shaped nitride liner, wherein the STI is on top of the U-shaped nitride liner and the U-shaped oxide liner;
   a logic device partially overlapping the STI;
   a first SONOS cell formed in a first overlapped region of the logic device and the STI; and
   a second SONOS cell formed in a second overlapped region of the logic device and the STI.

7. The semiconductor device with mini-SONOS cell of claim 6, wherein the logic device comprises a polysilicon layer and a gate oxide layer.

8. The semiconductor device with mini-SONOS cell of claim 6, wherein the STI comprises silicon oxide.

9. The semiconductor device with mini-SONOS cell of claim 6, wherein the first SONOS cell comprises a portion of the polysilicon layer and the gate oxide layer of the logic device, the STI, the first doped nitride layer, the U-shaped oxide liner, and the semiconductor substrate.

10. The semiconductor device with mini-SONOS cell of claim 9, wherein the first doped nitride layer comprises a p-type doped nitride layer.

11. The semiconductor device with mini-SONOS cell of claim 6, wherein the second SONOS cell comprises a portion of the polysilicon layer and the gate oxide layer of the logic device, the STI, the second doped nitride layer, the U-shaped oxide liner, and the semiconductor substrate.

12. The semiconductor device with mini-SONOS cell of claim 11, wherein the second doped nitride layer comprises a n-type doped nitride layer.

13. The semiconductor device with mini-SONOS cell of claim 1, wherein the top surface of the STI is higher than the top surfaces of the U-shaped nitride liner and the U-shaped oxide liner.

14. The semiconductor device with mini-SONOS cell of claim 6, wherein the top surface of the STI is higher than the top surfaces of the U-shaped liner and the U-shaped oxide liner.

* * * * *